United States Patent [19]

Skeie et al.

[11] Patent Number: 4,737,790

[45] Date of Patent: Apr. 12, 1988

[54] PASSIVE INTERROGATOR LABEL SYSTEM WITH A SURFACE ACOUSTIC WAVE TRANSPONDER OPERATING AT ITS THIRD HARMONIC AND HAVING INCREASED BANDWIDTH

[75] Inventors: Halvor Skeie, San Jose; Donald Armstrong, Belmont, both of Calif.

[73] Assignee: X-Cyte, Inc., Mountain View, Calif.

[21] Appl. No.: 835,616

[22] Filed: Mar. 3, 1986

[51] Int. Cl.$^4$ .................. G01S 13/80; H03H 9/64; H04B 1/59
[52] U.S. Cl. .................. 342/51; 310/313 B; 310/313 D; 333/154; 333/194
[58] Field of Search .................. 342/51, 44; 333/150–154, 193–195; 310/313 R, 313 A, 313 B, 313 L, 313 D; 340/572

[56] References Cited

U.S. PATENT DOCUMENTS

| | | | |
|---|---|---|---|
| 3,600,710 | 8/1971 | Adler | 310/313 B X |
| 3,936,774 | 2/1976 | Mellon et al. | 310/313 B X |
| 4,096,477 | 6/1978 | Epstein et al. | 342/51 X |

OTHER PUBLICATIONS

Holland et al., *Practical Surface Acoustic Wave Devices*, Proc. IEEE, vol. 62, No. 5, May 74, pp. 582–611.

*Primary Examiner*—T. H. Tubbesing
*Assistant Examiner*—Gilberto Barrón, Jr.
*Attorney, Agent, or Firm*—Karl F. Milde, Jr.

[57] ABSTRACT

A "passive interrogator label system" (PILS) is disclosed with passive, SAW transponders which are capable of receiving an interrogation signal, processing this signal and transmitting a reply signal that is derived from the interrogation signal and contains encoded information. The SAW transducers employed in the transponders are operated at their third harmonic and comprise split fingers which reduce SAW reflections. These transducers are also shaped to increase their bandwidth and to reduce their capacitance. The bus bars connecting the transducers are formed of double thickness to reduce ohmic resistance losses and these bus bars as well as the transponder phase delay pads have two levels of serrations on their edges to substantially cancel reflections. SAW reflectors in the transponder are provided with shorts between successive fingers to reduce ohmic resistance losses and to render them less susceptible to fabrication errors.

19 Claims, 11 Drawing Sheets

PASSIVE INTERROGATOR LABEL SYSTEM WITH A SURFACE ACOUSTIC WAVE TRANSPONDER OPERATING AT ITS THIRD HARMONIC AND HAVING INCREASED BANDWIDTH

CROSS-REFERENCE TO RELATED APPLICATIONS

The present application is related in subject matter to the following commonly-owned applications for patent:

Applications Ser. No. 509,523, filed June 30, 1983, to Paul A. Nysen, Halvor Skeie and Donald Armstrong for "System for Interrogating a Passive Transponder Carrying Phase-Encoded Information".

Application Ser. No. 793,165, filed Oct. 31, 1985, of Paul A. Nysen and Michael R. McCoy for "Passive Interrogator Label System Having Offset Compensation and Temperature Compensation For A Surface Acoustic Wave Transponder".

BACKGROUND OF THE INVENTION

The present invention relates to a system for transmitting first signals to, and receiving second signals from one or more remote transponders. More particularly, the invention relates to a radar system utilizing transponders which are capable of receiving an interrogating first signal, processing this signal and transmitting, in reply, a second signal that is derived from the first signal and contains encoded information.

Because the aforementioned encoded information normally includes an identification code which is unique to each transponder, and because the transponders of this type are relatively light weight and small and may be easily attached to other objects to be identified, the transponders are sometimes referred to as "labels". The entire system, including the interrogator/receiver apparatus and one or more passive transponders, is therefore often referred to as a "passive interrogator label system" or "PILS".

Passive interrogator label systems of the type to which the present invention relates are disclosed in the following U.S. patents:

| U.S. Pat. No. | Patentee |
| --- | --- |
| 3,273,146 | Horwitz, Jr. |
| 3,706,094 | Cole et al. |
| 3,755,803 | Cole et al. |
| 3,981,011 | Bell |
| 4,058,217 | Vaughan et al. |
| 4,059,831 | Epstein |
| 4,263,595 | Vogel |

Such a system is also disclosed in the commonly-owned patent applications referred to above.

In general, a passive interrogator label system includes an "interrogator" for transmitting a first radio frequency signal; at least one passive transponder which receives this first signal, processes it and sends back a second radio frequency signal containing encoded information; and a receiver, normally located next to the interrogator, for receiving the second signal and decoding the transponder-encoded information.

The aforementioned patent application Ser. No. 509,523 discloses a passive interrogator label system in which the interrogator transmits a first signal having a first frequency that successively assumes a plurality of frequency values within a prescribed frequency range. This first frequency may, for example, be in the range of 905–925 MHz, a frequency band that is freely available in many parts of the world for short range transmissions.

A passive (i.e., nonpowered) transponder associated with this system receives the first (interrogating) signal as an input and produces a second (reply) signal as an output. Passive signal transforming means within the transponder, which converts the first signal to the second signal, includes:

(1) A multiplicity of "signal conditioning elements" coupled to receive the first signal from a transponder antenna. Each signal conditioning element provides an intermediate signal having a known delay and a known amplitude modification to the first signal.

(2) A single "signal combining element" coupled to all of the signal conditioning elements for combining the intermediate signals (e.g., by addition or multiplication) to produce the second signal. This second signal is coupled out of the same or a separate antenna for transmission as a reply.

The signal conditioning elements and the signal combining element impart a known informational code to the second signal which identifies, and is associated with, the particular transponder.

The receiving and decoding apparatus associated with the system includes apparatus for receiving a second signal from the transponder and a mixer, arranged to receive both the first signal and the second signal, for performing four quadrant multiplication of these two signals. The mixer produces, as an output, a third signal containing the difference frequencies (or frequencies derived from the difference frequencies) of the first and second signals, respectively.

Finally, the system disclosed in the aforementioned U.S. patent application Ser. No. 509,523 includes a signal processor, responsive to the third signal produced by the mixer, for detecting the phases and amplitudes of the respective difference frequencies contained in the third signal, thereby to determine the informational code associated with the interrogated transponder.

This particular system has a number of advantages over passive interrogator label systems of the type disclosed in the issued U.S. patents referred to above. For example, this system exhibits substantially improved signal-to-noise performance over the prior known systems. Also, the output of the signal mixer—namely, the third signal which contains the difference frequencies of the first (interrogating) signal and the second (reply) signal—may be transmitted over inexpensive, shielded, twisted-pair wires because these frequencies are in the audio range. Furthermore, since the audio signal is not greatly attenuated when transmitted over long distances, the signal processor may be located at a position quite remote from the signal mixer.

In practice, the passive transponders used in the PILS described above comprise a microwave antenna and a surface acoustic wave ("SAW") device coupled to this antenna. Radiation, picked up by the antenna, is converted into electrical signals which are, in turn, converted into surface acoustic waves on the SAW device by one or more so-called "launch" transducers. These waves travel outward in opposite directions from opposite sides of these launch transducers and are then reconverted into electrical signals, after progressing along a plurality of paths of different lengths, either by separate receiving transducers or, after 180° reflections, by the same (launch) transducers.

Transponders of this type are susceptible to interference which reduces the signal-to-noise ratio of the reply signal that is transmitted by the transponder antenna back to the interrogator. Such interference is primarily caused by reflections from the various metallized elements disposed on the surface of the SAW device in the aforementioned travel paths. Such elements include bus bars, delay pads and even the launch and receiving transducers themselves. The amplitudes of such reflections are directly proportional to the change in velocity, ΔV, of a surface acoustic wave as it passes from a metallization-free surface area on the SAW device to a metallized surface area and vice versa. Such surface acoustic wave reflections are reconverted into electrical signals by the transducers in their paths of travel, resulting in spurious electrical signals that appear as noise in the transmitted reply signal.

SUMMARY OF THE INVENTION

It is a general object of the present invention to provide a passive interrogator label system (PILS) having one or more passive, SAW transponders which, when interrogated, produce replies with a higher signal-to-noise ratio than has been heretofore possible.

It is a further object of the present invention to reduce unwanted surface acoustic wave reflections in a passive, SAW transponder so as to improve the signal-to-noise ratio of the transponder replies.

It is a still further object of the present invention to provide a passive, SAW transponder in which unwanted surface acoustic wave reflections are reduced without substantially reducing the strengths of the transponder reply signals.

These objects, as well as further objects which will become apparent in the discussion that follows are achieved, according to the present invention, by providing a passive, SAW transponder having one or more of the following features:

(a) In order to reduce interference due to unwanted reflections, each transducer finger is split into two fingers of substantially equal width.

(b) In order to increase the split finger width to a size capable of photolithographic fabrication, the transducers are designed for a fundamental resonant frequency which is ⅓ the frequency at which these transducers are driven.

(c) In order to increase the bandwidth of the transducers to accommodate the frequency range of the interrogator, the transducers are constructed in several sections: a central section with a plurality of interdigital transducer fingers; two flanking sections with dummy transducer fingers and two outer sections each with a single pair of interdigital transducer fingers.

(d) In order to match the reactive impedance between the transponder antenna and the transducers, thereby to maximize the power transferred between this antenna and the transducers, each transducer is constructed as two serially-connected transducers so as to reduce its capacitance.

(e) In order to reduce the energy losses due to ohmic resistance in the transponder, the thickness and width of the transponder bus bars is substantially increased.

(f) In order to reduce interference due to unwanted reflections, the edges of delay pads as well as the bus bars in the transponder are serrated at two levels. The two levels of serrations are preferably square wave shaped with the same pulse height and a different periodicity.

(g) In order to reduce energy losses due to ohmic resistance and render them less susceptible to fabrication errors, successive fingers of SAW reflectors are shorted together at one or more locations.

For a full understanding of the present invention, reference should now be made to the following detailed description of the preferred embodiments of the invention and to the accompanying drawings.

DESCRIPTION OF THE PREFERRED EMBODIMENTS

Figure 1:
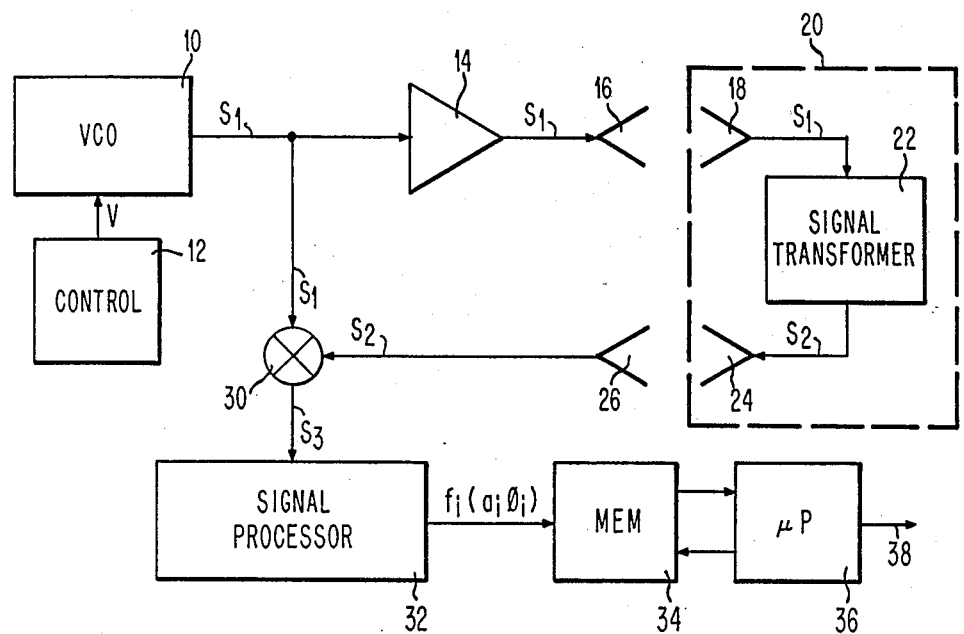
FIG. 1 is a block diagram of a passive interrogator label system of the type disclosed in the aforementioned U.S. patent application Ser. No. 509,523.

The preferred embodiments of the present invention will now be described with reference to FIGS. 1-20 of the drawings. Identical elements in the various figures are designated with the same reference numerals.

FIG. 1 shows the general construction of the passive interrogator label system disclosed in the aforementioned U.S. patent application Ser. No. 509,523. This system comprises a voltage controlled oscillator 10 which produces a first signal S1 at a radio frequency determined by a control voltage V supplied by a control unit 12. This signal S1 is amplified by a power amplifier 14 and applied to an antenna 16 for transmission to a transponder 20.

The signal S1 is received at the antenna 18 of the transponder 20 and passed to a signal transforming element 22. This signal transformer converts the first (interrogation) signal S1 into a second (reply) signal S2. The signal S2 is passed either to the same antenna 18 or to a different antenna 24 for transmission back to the interrogator/receiver apparatus. This second signal S2 carries encoded information which, as a minimum, identifies the particular transponder 20.

The second signal S2 is picked up by a receiving antenna 26. Both this signal S2 and the first signal S1 (or respective signals derived from these two signals) are applied to a mixer (four quadrant multiplier) 30. The signals S1 and S2 are thus mixed or "heterodyned" in the mixer 30 to produce a third signal S3 containing frequencies which include both the sums and the differences of the frequencies contained in the signals S1 and S2. The signal S3 is passed to a signal processor 32 which determines the amplitude $a_i$ and the respective phase $\phi_i$ of each frequency component $f_i$ among a set of audio-frequency components ($f_0, f_1, f_2 \ldots$) in the signal S3. Each phase $\phi_i$ is determined with respect to the phase $\phi_0 = 0$ of the lowest frequency component $f_0$.

The information determined by the signal processor 32 is passed to a microcomputer comprising a random access memory 34 and a microprocessor 36. This microcomputer continuously analyzes the frequency, amplitude and phase information and makes decisions based upon this information. For example, the microcomputer may determine the identification number of the interrogated transponder 20. This ID number and/or other decoded information is made available at an output 38.

Figure 2:
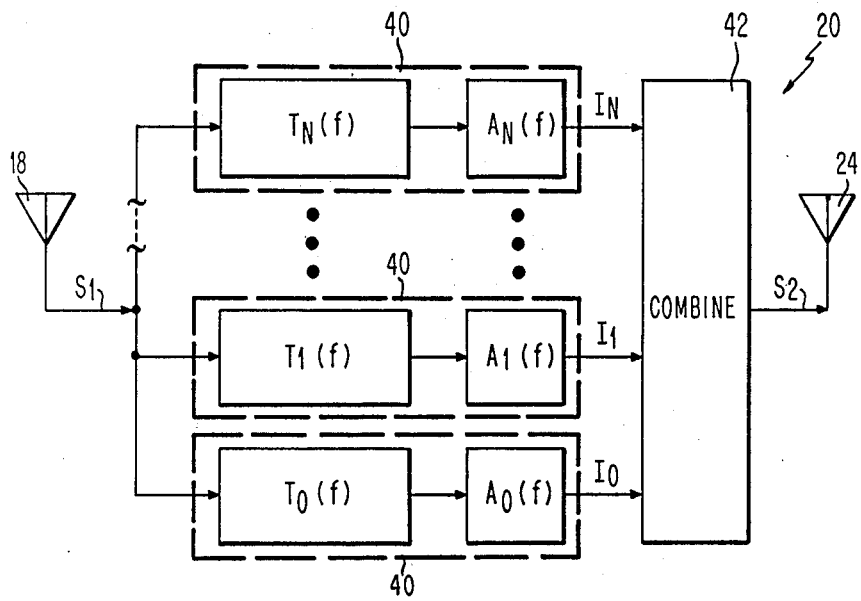
FIG. 2 is a block diagram of a transponder or "label" which is used in the system of FIG. 1.

FIG. 2 illustrates the nature and operation of the transponder 20. This transponder may be an entirely passive device, or it may contain a power source and one or more active elements. As may be seen, the signal transforming element 22, indicated as a block in FIG. 1, comprises a number $N+1$ of signal conditioning elements 40 and a signal combining element 42. The signal conditioning elements 40 are each connected to the antenna 18 and receive the transmitted interrogation signal S1. Each signal conditioning element 40 produces a respective intermediate signal $I_0, I_1 \ldots I_N$ as an output. These intermediate signals are passed to the combining element 42 which combines them (e.g., by addition, multiplication or the like) to form the reply signal S2.

As may be seen in FIG. 2, each signal conditioning element 40 comprises a known delay $T_i$ and a known amplitude modification $A_i$ (either attenuation or amplification). The respective delay $T_i$ and amplitude modification $A_i$ may be functions of the frequency of the received signal S1, or they may provide a constant delay and constant amplitude modification, respectively, independent of frequency. The order of the delay and amplitude modification elements may be reversed; that is, the amplitude modification elements $A_i$ may precede the delay elements $T_i$. Amplitude modification $A_i$ can also occur within the path $T_i$.

Figure 3A:
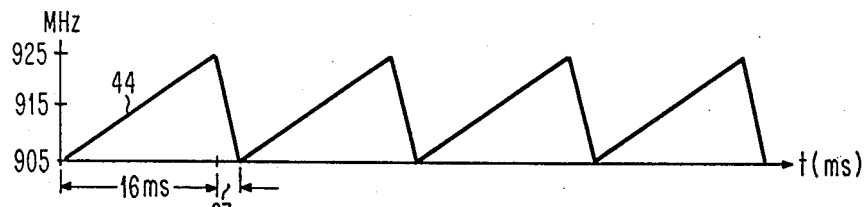
FIGS. 3A and 3B are time diagrams, drawn to different scales, of the radio frequencies contained in the interrogation and reply signals transmitted with the system of FIG. 1.
Figure 3B:
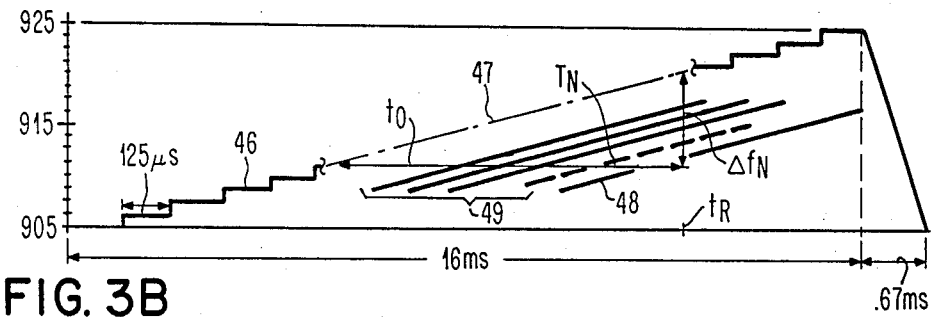

FIGS. 3A and 3B illustrate the frequency of the first signal S1 in the passive interrogator label system shown in FIG. 1. The voltage controlled oscillator 10 is controlled to produce a sinusoidal RF signal with a frequency that is swept in 128 equal steps from 905 MHz to 925 MHz. Each frequency step is maintained for a period of 125 microseconds so that the entire frequency sweep is carried out in 16 milliseconds. Thereafter, the frequency is dropped back to 905 MHz in a relaxation period of 0.67 milliseconds. The stepwise frequency sweep 46 shown in FIG. 3B thus approximates the linear sweep 44 shown in FIG. 3A.

Assuming that the stepwise frequency sweep 44 approximates an average, linear frequency sweep or "chirp" 47, FIG. 3B illustrates how the transponder 20, with its known, discrete time delays $T_0, T_1 \ldots T_N$ produces the second (reply) signal S2 with distinct differences in frequency from the first (interrogation) signal S1. Assuming a round-trip, radiation transmission time of $t_0$, the total round-trip times between the moment of transmission of the first signal and the moments of reply of the second signal will be $t_o+T_0, t_o+t_1, \ldots t_o+T_N$, for the delays $T_o, T_1 \ldots T_N$, respectively. Considering only the transponder delay $T_N$, FIG. 3B demonstrates that, at the same time $t_R$ when the second (reply) signal is received at the antenna 26, the frequency 48 of this second signal will be $\Delta f_N$ less than the instantaneous frequency 47 of the first signal S1 transmitted by the antenna 16. Thus, if the first and second signals are mixed or "heterodyned", this frequency difference $\Delta f_N$ will appear in the third signal as a beat frequency. Understandably, other beat frequencies will also result from the other delayed frequency spectra 49 resulting from the time delays $T_0, T_1 \ldots T_{N-1}$.

In mathematical terms, we assume that the phase of a transmitted interrogation signal is:

$$\phi = 2\pi f \tau$$

where $\tau$ is the round-trip transmission time delay.
For a ramped frequency df/dt or $\dot{f}$, we have:

$$2\pi \dot{f} \tau = d\phi/dt = \omega.$$

$\omega$, which is the beat frequency, is thus determined by $\tau$ for a given ramped frequency or chirp $\dot{f}$.

Figure 4:
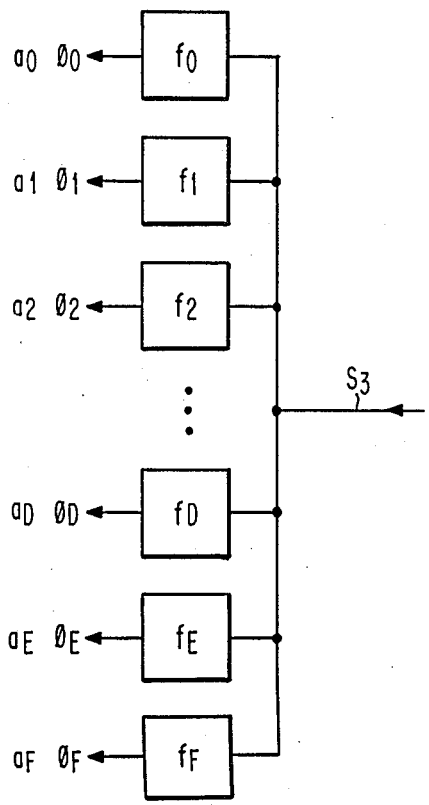
FIG. 4 is a block diagram illustrating the decoding process carried out by the signal processor in the system of FIG. 1.

The function of the signal processor 32 in the system of FIG. 1 is illustrated in FIG. 4. As may be seen, the signal S3 is applied to sixteen bandpass filters, each tuned to a different beat frequency, $f_0, f_1 \ldots f_E, f_F$. The signal processor determines the amplitudes and phases of the signals that pass through these respective filters. These amplitudes and phases contain the code or "signature" of the particular signal transformer 22 of the interrogated transponder 20.

In practice, the amplitudes and phases are determined by a well-known "matched filter" calculation; that is, the in-phase or cosinusoid parts and quadrature phase or sinusoid parts of a known waveform are multiplied, term by term, by those of the incoming waveform to determine the correlation or "degree of match". For each of the sixteen frequencies, the signal processor 32 determines two 16-bit numbers, which are the real and imaginary parts, respectively, of the complex phase and amplitude. The amplitude or power ($a_i$) as well as the phase ($\phi_i$) at each respective frequency is then calculated as follows:

$$a_i = [R^2 + I^2]^{\frac{1}{2}} \text{ and}$$

$$\phi_i = \text{arc tan } I/R,$$

where R is the real part and I is the imaginary part of the complex number.

Thereafter, the signal processor 32 stores the amplitude and phase quantities in the RAM 34 for further processing by the microprocessor 36. This microprocessor 36 normalizes the amplitudes and checks to make sure that all amplitudes are within the ripple limit. If one or more of the sixteen amplitudes are above or below the acceptable tolerances, the transponder reading is rejected.

If the amplitudes are within their prescribed limits, the microprocessor 36 determines the differences, modulo 360, of each of the fifteen phases ($\phi_1, \phi_2 \ldots \phi_D, \phi_E, \phi_F$) with respect to the first phase $\phi_0$; i.e., $\phi_{01} = \phi_0 - \phi_1$ mod 360°, $\phi_{02} = \phi_0 - \phi_2$ mod 360°, $\phi_{03} = \phi_0 - \phi_3$ mod 360°, etc. Each of these phase differences is then located in one of the following four phase "bins":

(1) 0° ±30°;
(2) 90° ±30°;
(3) 180° ±30°;
(4) 270° ±30°.

If any phase difference (modulo 360°) with respect to $\phi_o$ falls outside of these "bins" (i.e., the ranges given above), then the transponder reading is rejected.

If all the sixteen amplitudes and fifteen phase differences are within their prescribed limits, then the selected "bins" are converted to a transponder identification number which can be as high as $4^{15}$ (assuming that each of the fifteen phase differences can fall into one of four bins). This number is then presented on the microprocessor output line 38.

While the transponder 20 illustrated in FIGS. 1 and 2 can be implemented with a variety of well-known circuits and techniques, in the preferred embodiments of the present invention, the transponders comprise passive surface acoustic wave (SAW) devices to provide the respective delays $T_0, T_1 \ldots T_N$. This type of transponder may be represented in block form in the manner shown in FIG. 5.

Figure 5:
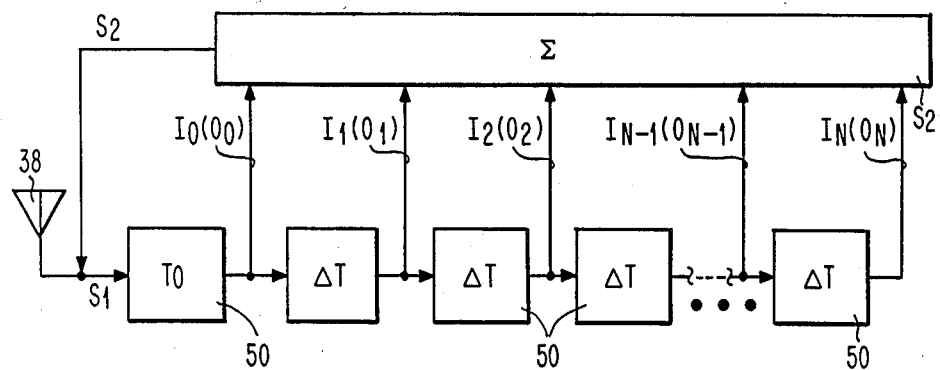
FIG. 5 is a block signal diagram of a passive transponder which may be used with the system of FIG. 1.

The transponder of FIG. 5 receives the signal S1 at its antenna 38 and passes this signal to a series of delay elements 50 having the indicated delay periods $T_0$ and T. After passing each successive delay, a portion of the signal $I_0, I_1, I_2 \ldots I_N$ is tapped off and supplied to a summing element 52. The resulting signal S2, which is the sum of the intermediate signals $I_0 \ldots I_N$, is fed back to the antenna 38 for retransmission to the antenna 26 in the system of FIG. 1.

Figure 6:
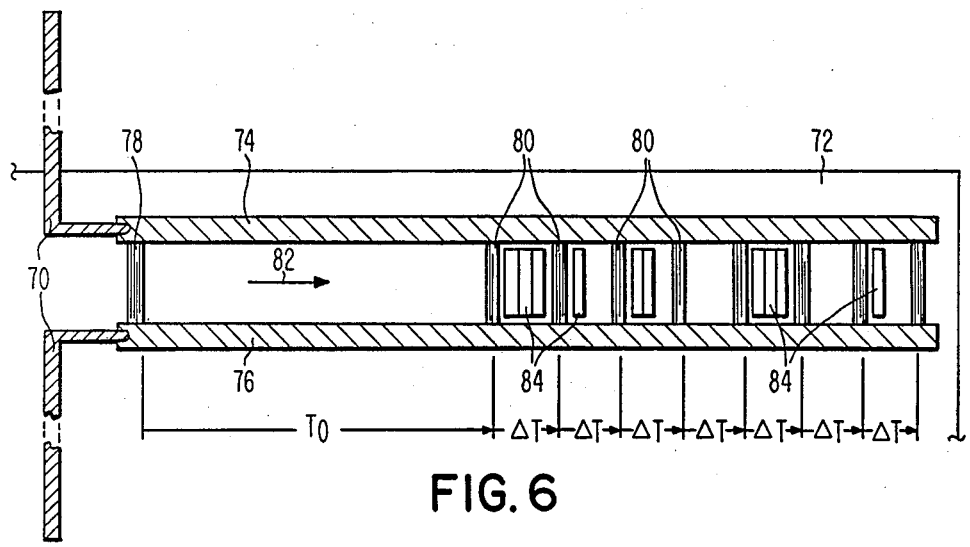
FIG. 6 is a plan view, in enlarged scale, of a first configuration of the transponder of FIG. 5.
Figure 7:
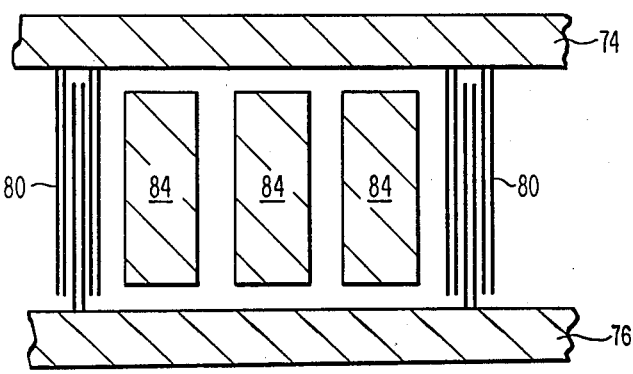
FIG. 7 is a plan view, in greatly enlarged scale, of a portion of the transponder configuration shown in FIG. 6.

FIGS. 6 and 7 illustrate a first configuration of the passive SAW transponder represented in FIG. 5. In this embodiment, a common transmit/receive antenna, formed by a dipole 70, is connected to, and arranged adjacent a SAW device made of a substrate 72 of piezoelectric material such as lithium niobate. On the surface of this substrate is deposited a layer of metal, such as aluminum, forming a metallized structure of the type shown in detail in FIG. 7. This structure consists of two bus bars 74 and 76 connected to the dipole antenna 70, a "launch" transducer 78 and a plurality of "tap" transducers 80. When excited by a signal received from the antenna 70, the launch transducer 78 generates a surface acoustic wave that propogates substantially linearly along the path 82, reaching the tap transducers 80 in each turn. The tap transducers convert the surface acoustic wave back into electrical signals and these are collected, and therefore summed, by the bus bars 74 and 76. The summed electrical signal, in turn, activates the dipole antenna 70 and is converted into electromagnetic radiation for transmission as the second signal S2.

The tap transducers 80 are provided at equally spaced intervals along the surface acoustic wave path 82, as shown in FIG. 6. An informational code associated with the transponder is imparted by providing a selected number of "delay pads" 84 between the tap transducers. These delay pads, which are shown in detail in FIG. 7, are preferably made of the same material as, and deposited on the substrate together with the bus bars 74, 76 and the transducers 78, 80. Each delay pad has a width sufficient to delay the propagation time of the surface acoustic wave from one tap transducer 80 to the next by the period of one quarter cycle or 90 degrees with respect to an undelayed wave at the frequency of operation (about 915 MHz). By providing locations for three delay pads between successive tap transducers, the phase of the surface acoustic wave received by a tap transducer may be controlled to provide four distinct phase possibilities:

(1) no pads between successive tap transducers = 0°;
(2) one pad between successive tap transducers = 90°;
(3) two pads between successive tap transducers = 180°; and
(4) three pads between successive tap transducers = 270°.

The phase information, which is contained in the second (reply) signal S2 transmitted by the antenna 70, thus contains the informational code of the transponder.

While the transponder shown in FIGS. 6 and 7 converts a first (interrogation) signal S1 into a second (reply) signal S2 with the respective time delays represented in FIG. 5, other transponder configurations may provide superior performance in implementing this response.

Figure 8:
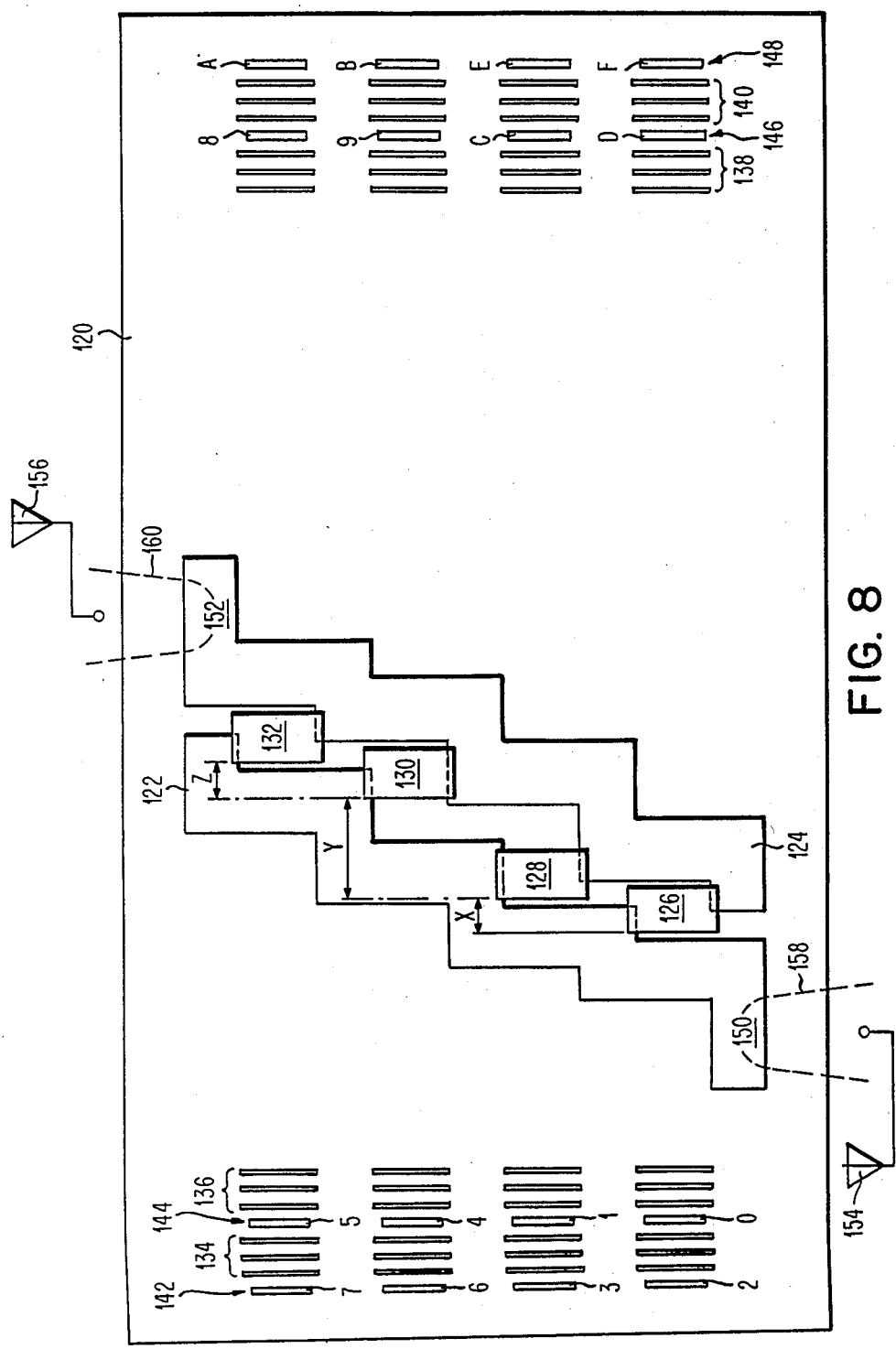
FIG. 8 is a representational diagram, in plan view, of a second configuration of the transponder of FIG. 5.
Figure 9:
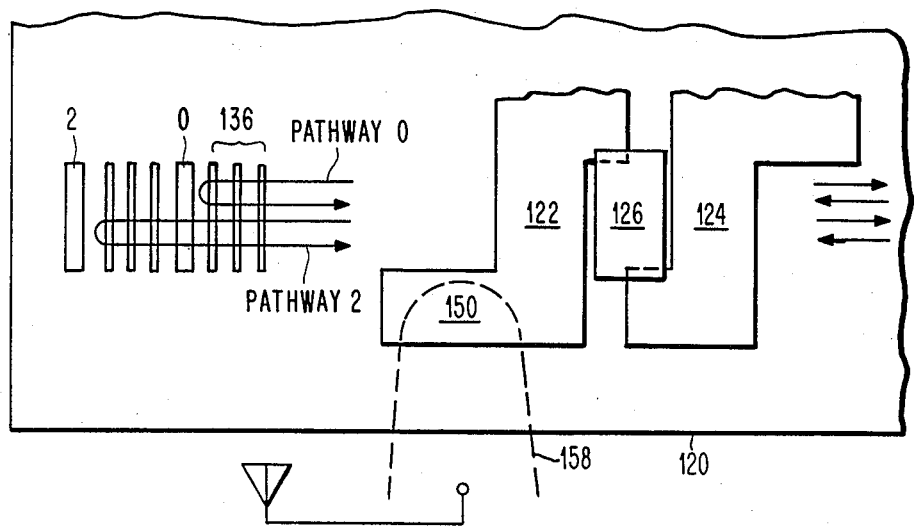
FIG. 9 is a plan view, in greatly enlarged scale, of a portion of the transponder configuration shown in FIG. 8.

FIGS. 8 and 9 show the preferred embodiment of a passive SAW transponder which may be employed in a system according to the present invention.

The embodiment of FIG. 8 comprises a substrate 120 of piezoelectric material, such as lithium niobate, on which is deposited a pattern of metallization essentially as shown. The metallization includes two bus bars 122 and 124 for the transmission of electrical energy to four launch transducers 126, 128, 130 and 132. These launch transducers are staggered, with respect to each other, with their leading edges separated by distances X, Y and Z, respectively. The distances X and Z are identical; however, the distance Y is larger than X and Z for reasons which will become clear below. Further metallization includes four parallel rows of delay pads 134, 136, 138 and 140 and four parallel rows of reflectors 142, 144, 146 and 148. The two rows of reflectors 144 and 146 which are closest to the transducers are called the "front rows" whereas the more distant rows 142 and 148 are called the "back rows" of the transponder.

The bus bars 122 and 124 include contact pads 150 and 152, respectively, to which are connected the associated poles 154 and 156 of a dipole antenna. These two poles are connected to the contact pads by contact elements or wires 158 and 160, represented in dashed lines.

The provision of four transducers 126, 128, 130 and 132 and two rows of reflectors 142, 144, 146 and 148 on each side of the transducers results in a total of sixteen SAW pathways of different lengths and, therefore, sixteen "taps". These sixteen pathways (taps) are numbered 0, 1, 2 . . . D, E, F, as indicated by the reference number (letter) associated with the individual reflectors. Thus, pathway 0 extends from transducer 126 to reflector 0 and back again to transducer 126 as shown in FIG. 9. Pathway 1 extends from transducer 128 to reflector 1 and back again to transducer 128. The spacial difference in length between pathway 0 and pathway 1 is twice the distance X (the offset distance between transducers 126 and 128). This results in a temporal difference of ΔT in the propagation time of surface acoustic waves.

Similarly, pathway 2 extends from transducer 126 to reflector 2 and back again to transducer 126. Pathway 3 extends from transducer 128 to reflector 3 and back to transducer 128. The distance X is chosen such that the temporal differences in the length of the pathway 2 with respect to that of pathway 1, and the length of the pathway 3 with respect to that of pathway 2 are also both equal to ΔT.

The remaining pathways 4, 5, 6, 7 . . . E, D, F are defined by the distances from the respective transducers launching the surface acoustic waves to the associated reflectors and back again. The distance Y is equal to substantially three times the distance X so that the differences in propagation times between pathway 3 and pathway 4 on one side of the device, and pathway B and pathway C on the opposite side are both equal to ΔT. With one exception, all of the temporal differences, from one pathway to the next successive pathway are equal to the same ΔT. The SAW device is dimensioned so that ΔT nominally equals 100 nanoseconds.

In order to avoid the possibility that multiple back and forth propagations along a shorter pathway (one of the pathways on the left side of the SAW device as seen in FIG. 8) appear as a single back and forth propagation along a longer pathway (on the right side of the device), the difference in propagation times along pathways 7 and 8 is made nominally equal to 150 nanoseconds. Specifically, the nominal periods of propagation (tap delays) along each of the sixteen pathways, and the third signal (mixer) difference frequency resulting from each of these tap delays, are as follows:

TABLE

| Pathway (Tap) | Tap Delay (ns) | Corresponding Difference Frequency (Hz) |
| --- | --- | --- |
| 0 | 900 | 1155 |
| 1 | 1000 | 1281 |
| 2 | 1100 | 1407 |
| 3 | 1200 | 1533 |
| 4 | 1300 | 1659 |
| 5 | 1400 | 1785 |
| 6 | 1500 | 1911 |
| 7 | 1600 | 2037 |
| 8 | 1750 | 2232 |
| 9 | 1850 | 2358 |
| A | 1950 | 2484 |
| B | 2050 | 2610 |
| C | 2150 | 2736 |
| D | 2250 | 2862 |
| E | 2350 | 2988 |

TABLE-continued

| Pathway (Tap) | Tap Delay (ns) | Corresponding Difference Frequency (Hz) |
| --- | --- | --- |
| F | 2450 | 3114 |

As explained above in the "Background of the Invention" section, a passive SAW transponder of this type is susceptible to signal interference resulting from unwanted reflections of surface acoustic waves each time the velocity of a wave undergoes an abrupt change ΔV. Thus, for example, in the pathway 0 shown in FIG. 9, reflections may occur from the individual interdigital fingers of the transducer 126, from the edges of the bus bar 122, and from the edges of the delay pads 136. Reflections will occur from both lateral edges of the transducer fingers, bus bar 122 and delay pads 136; i.e., as the velocity changes abruptly in either the positive or negative direction.

According to a first feature of the invention, reflections from the interdigital fingers of the transducers 126, 128, 130 and 132 are split into two, separate, half-width fingers to reduce reflections from each finger.

Figure 10:
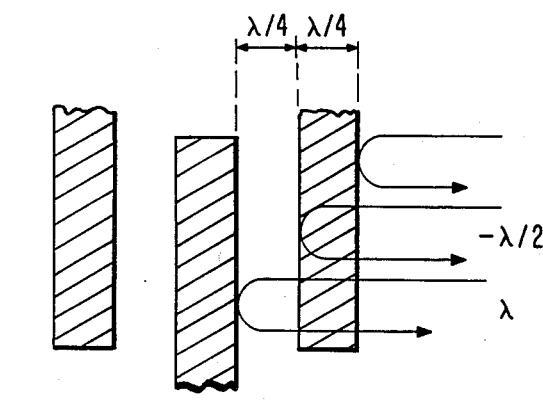
FIG. 10 is a diagram illustrating SAW reflections from conventional transducer fingers.

As is shown in FIG. 10, a surface acoustic wave will be partially reflected from each of the lateral edges of conventional transducer fingers. Since successive fingers in a transducer must be displaced by a distance of λ/2, where λ is the SAW wavelength at the resonant frequency of the transducer, the SAW wavefront that passes beneath a first finger and is reflected from the leading edge of a second finger will be in phase with a reflection from the leading edge of the first finger. This occurs because the wavefront must travel a distance of λ/2 from the leading edge of the first finger to the leading edge of the second finger, and back again, so that the total distance travelled will be λ. This results in positive reinforcement of the two wavefronts resulting in a maximum reflection.

Similarly, the wavefront reflected from the trailing edge of a finger will be in phase with a wavefront reflected from the leading edge of this same finger. This occurs because the surface acoustic wave reflected from the trailing edge must travel a distance λ/2 farther than the wave reflected from a leading edge; furthermore, there is a phase reversal upon reflection from a trailing edge so that the difference in phase will be −λ/2. Accordingly, the wavefront reflected from the trailing edge of a finger will also coincide with the wavefront reflected from the leading edge resulting in a positive reinforcement and consequent maximum reflection.

Figure 11:
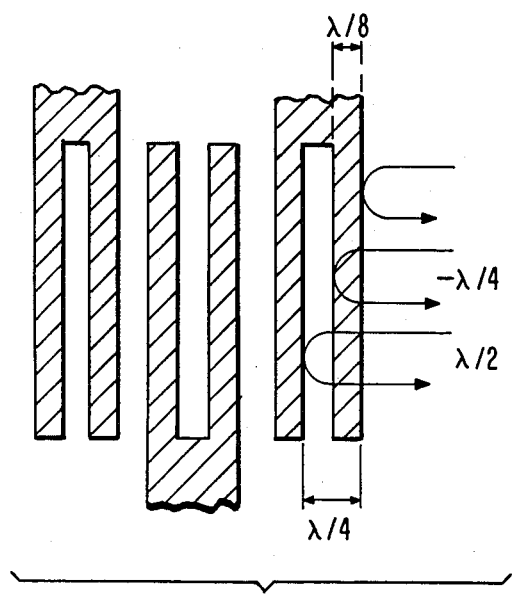
FIG. 11 is a diagram illustrating SAW reflections from split transducer fingers, according to the invention.

FIG. 11 illustrates how phase cancellation occurs with SAW waves reflected from transducer fingers which are longitudinally split. Each finger is divided into two parallel and electrically-connected fingers of width λ/8. The leading edges of successive fingers in the transducer are spaced apart a distance of λ/4.

As shown in FIG. 11, a wavefront produced by reflections from the leading and trailing edges of these fingers will be formed by the superposition of a first wave reflected from the first leading edge and successive waves reflected from successive edges and having differences in phase, with respect to the first wave, of −λ/4, λ/2, −3 λ/4, λ, etc. As may be seen, the wave components having a phase −λ/4, λ/2 and −3 λ/4 effect a cancellation, or at least an attenuation of the wave component reflected from the leading edge.

According to a first feature of the present invention, therefore, the interdigital fingers of the transducers are split in the manner illustrated in FIG. 11 to reduce reflections.

Conventional interdigital finger transducers of the type shown in FIG. 10 which are constructed to operate at a fundamental, resonant frequency of 915 MHz have a finger width ($\lambda/4$) of approximately 1 micron: a size which approaches the resolution limit of photolithographic fabrication (the selective removal of metallization by (1) exposure of photoresist through a mask and (2) subsequent etching of the metallized surface to selectively remove the metal between and outside the transducer fingers). If the fingers are split, as shown in FIG. 11, the width of each finger ($\lambda/8$) for a fundamental frequency of 915 MHz would be approximately $\frac{1}{2}$ micron. The size is too small for state-of-the-art photolithographic fabrication.

According to a second feature of the present invention, therefore, the transducers in the transponder are constructed with a resonant frequency $f_0$ of 305 MHz. In this case, the width of each finger is three times larger than transducer fingers designed to operate at 915 MHz, so that the width ($\lambda/8$) of the split fingers shown in FIG. 11 is approximately 1$\frac{1}{2}$ microns. This is well within the capability of state-of-the-art photolithographic fabrication.

Although the transducers are constructed with a resonant frequency of 305 MHz, they are nevertheless driven at the interrogation frequency of approximately 915 MHz; i.e., a frequency $3f_0$ which is the third harmonic of 305 MHz.

Figure 12:
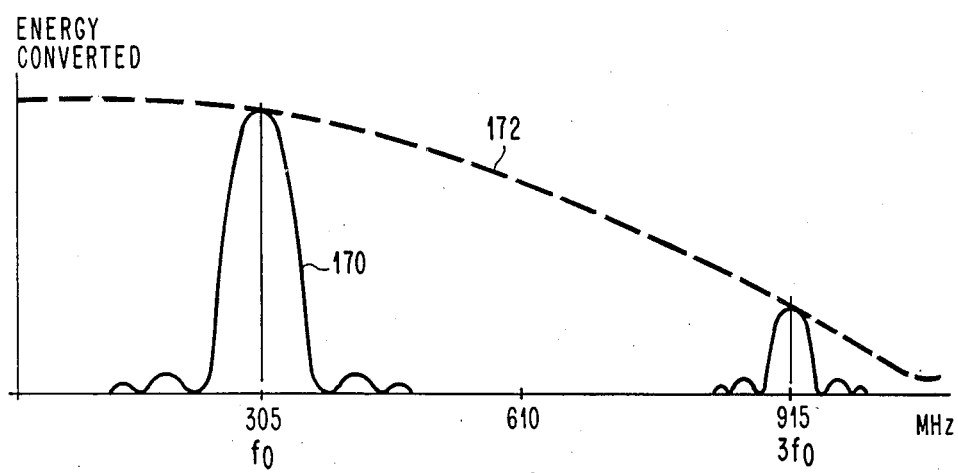
FIG. 12 is a diagram illustrating the energy converted by a SAW transducer at its fundamental (resonant) frequency and at its third harmonic.

FIG. 12 is a diagram showing the energy converted (electrical energy to SAW energy and vice versa) by the transducers employed in the passive SAW transponder of FIGS. 8 and 9. As may be seen, the transduced energy has a sin x/x characteristic 170 centered about the fundamental frequency $f_0$ and the odd harmonics: $3f_0$, $5f_0$, etc. The peak of the sin x/x function falls off abruptly with higher harmonics as indicated by the dashed line 172. The transducers do not couple any energy into or out of the piezoelectric crystal at the even harmonics ($2f_0$, $4f_0$ . . . ).

The energy converted by a transducer, when driven in its third harmonic $3f_0$ (915 MHz), is about $\frac{1}{3}$ of the energy that would be converted if the transducer were driven at its fundamental frequency $f_0$ (305 MHz). Accordingly, it is necessary to construct the transducers to be as efficient as possible within the constraints imposed by the system. As is well known, it is possible to increase the percentage of energy converted, from electrical energy to SAW energy and vice versa, by increasing the number of fingers in a transducer. In particular, the converted signal amplitude is increased by about 2% for each pair of transducer fingers (either conventional fingers or split fingers) so that, for 20 finger pairs for example, the amplitude of the converted signal will be about 40% of the original signal amplitude. Such an amplitude percentage would be equivalent to an energy conversion of about 16%. In other words, the energy converted will be about 8 db down from the supplied energy.

The addition of finger pairs to the transducers therefore advantageously increases the energy coupling between electrical energy and SAW energy. However, as explained above in connection with FIGS. 1 and 3, the system according to the invention operates to excite the transducers over a range of frequencies between 905 MHz and 925 MHz. This requires the transducers to operate over a 20–25 MHz bandwidth: a requirement which imposes a constraint upon the number of transducer finger pairs because the bandwidth of a transducer is inversely proportional to its physical width. This relationship arises from the fact that the bandwidth is proportional to $1/\tau$, where $\tau$ is the SAW propagation time from one side of the transducer to the other (the delay time across the transducer).

For a transducer driven at its third harmonic of 915 MHz, the spacing between successive fingers (single fingers or split fingers) is $3\lambda/2$, where $\lambda$ is the SAW wavelength at 915 MHz. Such a transducer will therefore be three times as wide as a transducer having the same number of finger pairs but which is designed with a finger pair spacing of $\lambda/2$ for a fundamental of 915 MHz.

Therefore, a transducer driven at its third harmonic will have $\frac{1}{3}$ the number of finger pairs for a given bandwidth than a transducer, also driven at that same frequency, which operates at its fundamental or resonant frequency.

Figure 13:
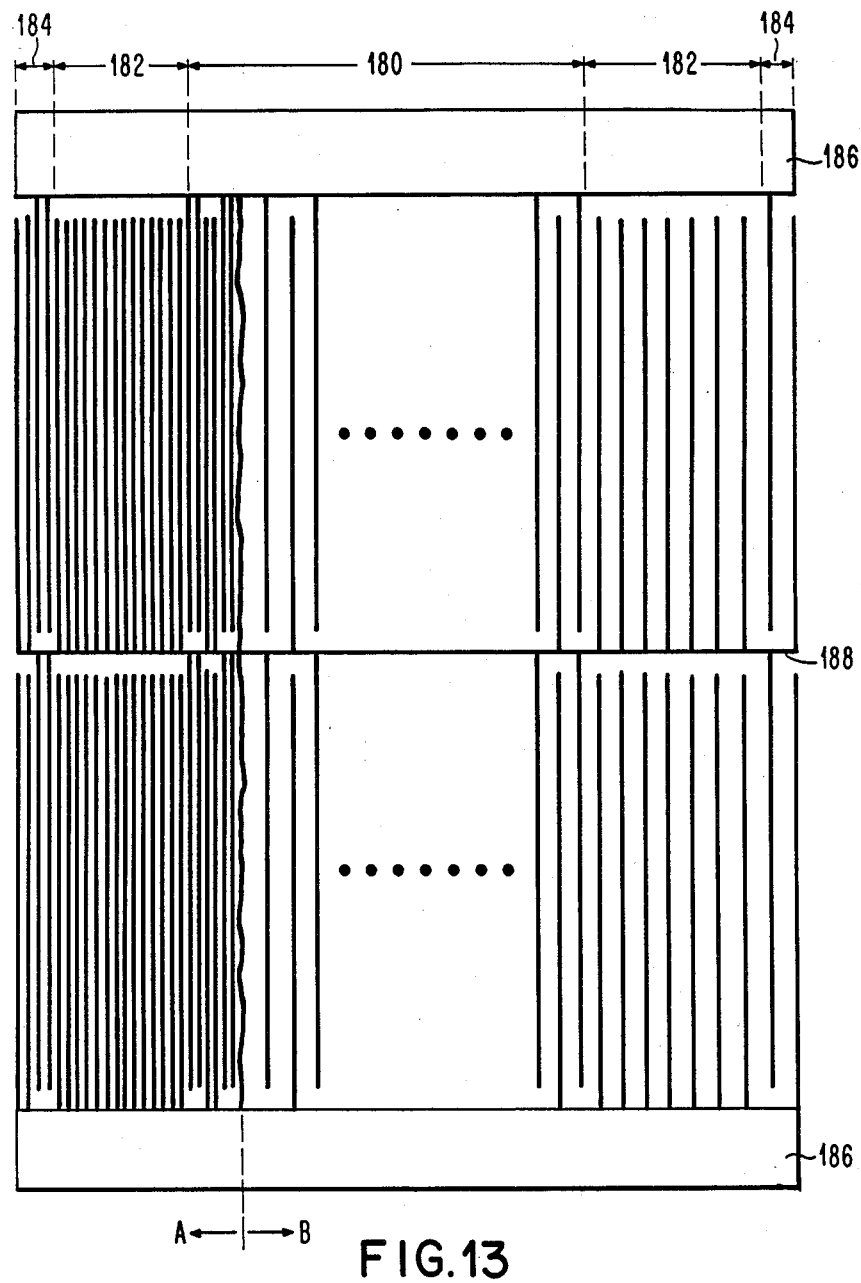
FIG. 13 is a representational diagram, in plan view, of a launch and/or receiving transducer of the type employed in the transponder of FIGS. 6 and 8.

FIG. 13 illustrates the transducer structure according to the invention which is designed to maximize energy coupling while providing a frequency bandwidth of approximately 25 MHz at around 915 MHz. This diagram is representational, insofar as the individual fingers of the transducer are drawn as single lines. It will be understood, however, that these fingers are formed of metallization with a prescribed width as illustrated in FIG. 11.

The entire transducer is constructed with split fingers as shown in the lefthand section "A" of FIG. 13. For clarity, however, the split fingers in the righthand section "B" have been represented as single lines. As indicated above, each half finger in the transducer of FIG. 13 has a width of $\lambda_0/8$, where $\lambda_0$ is the SAW wavelength at the transducer fundamental frequency of 305 MHz. Stated another way, the width of each half finger in a split finger pair is $3\lambda/8$, where $\lambda$ is the wavelength of the third harmonic at 915 MHz.

As shown at the top of FIG. 13, the transducer is divided into several separate sections: a central section 180, two flanking sections 182 and two outer sections 184. The central section 180 is comprised of interdigital transducer fingers which are alternately connected to two outer bus bars 186 and to a central electrical conductor 188. This central section comprises a sufficient number of finger pairs to convert a substantial percentage of electrical energy into SAW energy and vice versa. By way of example and not limitation, there may be 12 finger pairs so that the converted amplitude is approximately 24% of the incoming signal amplitude.

Flanking the central section, on both sides, are sections 182 containing "dummy" fingers; that is, fingers which are connected to one electrode only and therefore serve neither as transducers nor reflectors. The purpose of these fingers is to increase the width of the transducer so that the outer sections 184 will be spaced a prescribed distance, or SAW delay time, from the central section 180. By way of example and not limitation, there may be 7 dummy fingers (or, more particularly, split fingers) in each of the sections 182.

Figure 14:
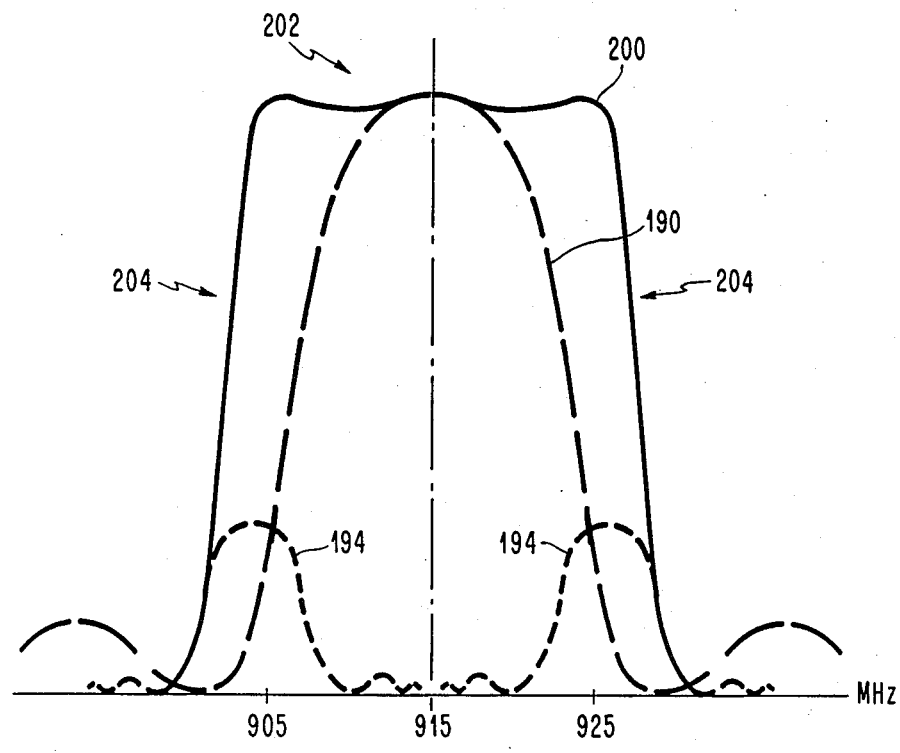
FIG. 14 is a diagram showing the operational bandwidth of the transducer of FIG. 13.

Finally, each of the outer sections 184 of the transducer contains a single transducer finger pair which is used to shape the bandwidth of the transducer of FIG. 13. Referring to FIG. 14 illustrating the coupling response of the transducer of FIG. 13, there is shown the usual sin x/x function 190 that corresponds to the center section 180 and two sin x/x functions 194 that correspond to the outer transducer sections 184. When superimposed, the functions 190 and 194 produce a combined frequency characteristic 200 having a widened, and substantially flat upper portion 202 and steeply sloping sides 204. As a consequence, the bandwidth of the transducer of FIG. 13 is increased to the required 25 MHz.

According to still another feature of the present invention, the transducer of FIG. 13 is constructed to closely match the impedance of the dipole antenna 154, 156 to which it is connected. This impedance match maximizes the transfer of energy between the radiation transmitted to and from the antenna and the acoustic energy within the SAW device.

The impedance of a SAW transducer comprises a relatively large capacitance created by its interdigital fingers plus a small ohmic resistance. With a conventional transducer, this capacitance is several times greater than the reactive impedance (inductance and capacitance) of a microwave dipole antenna designed to operate a 915 MHz.

According to this feature of the invention, "complex conjugate" matching is employed so that the reactive components in the impedance of both the antenna and the transducers substantially cancel each other. This is accomplished by constructing each transducer as two serially connected partial transducers.

Figure 15A:
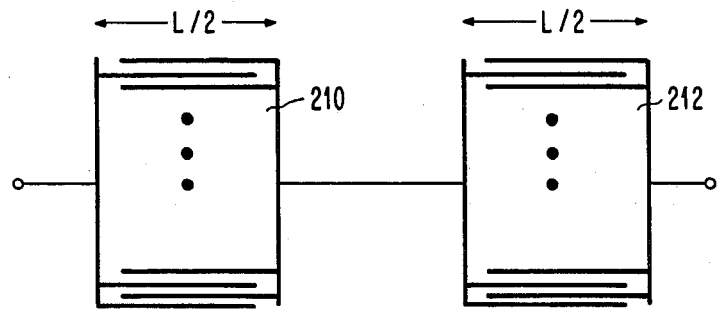
FIG. 15A is a representational diagram of two transducers connected in series.

FIG. 15A shows two partial transducers 210 and 212 connected in series. If we assume that a conventional transducer having interdigital fingers of total width length L has a capacitance of $C_0$, then the capacitance of each of the transducers 210 and 212, which have total finger widths of L/2, will be $C_0/2$. The capacitance, X, of the series connected transducer circuit is therefore:

$$2/C_0 + 2/C_0 = 1/X$$

$$X = C_0/4$$

By dividing a conventional transducer into two, serially connected partial transducers, the capacitance of the circuit is reduced by ¼.

Figure 15B:
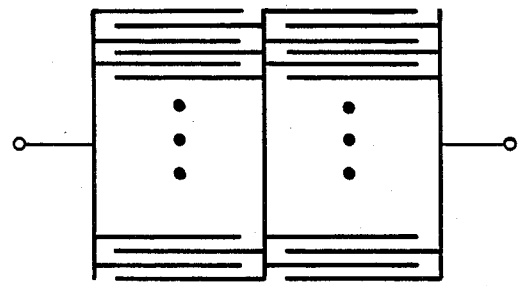
FIG. 15B is a representational diagram of a single transducer formed of two separate transducers connected in series.

FIG. 15B illustrates how the two partial transducers 210 and 212 are combined, in the manner also shown in FIG. 13, to form a single transducer.

Since, according to the invention, the reactive components of the antenna 154, 156 and the four, parallel connected transducers 126, 128, 130 and 132 are closely matched, the power loss within the transponder is limited to the non-reactive (i.e., heat) losses within the antenna, the four transducers and the two bus bars 122 and 124. In this case, the power coupled into the SAW device is directly proportional to the total resistance according to the formula:

$$P = r_{total} i^2,$$

where the current i remains constant from a "complex conjugate" matched circuit and $r_{total}$ is given by:

$$r_{total} = r_\Omega + r_a.$$

$r_\Omega$ in this formula is the total ohmic electrical resistance in the antenna, bus bars and transducers and $r_a$ is the equivalent resistance (heat loss) due to the energy coupled into the SAW device substrate.

In order to maximize the energy coupled into the SAW device, it is desirable to decrease the ohmic resistance $r_\Omega$ so as to reduce the loss ratio:

$$r_a/r_t = \frac{1}{r_\Omega/r_a + 1}$$

Particularly when $r_\Omega$ is approximately the same order of magnitude as $r_a$ so that the loss ratio is as low as ½, the value of $r_\Omega$ is a significant factor in the power response of the transponder.

Therefore, according to still another feature of the present invention, the bus bars 122 and 124 are made considerably thicker than the other metallized elements on the SAW device substrate in order to reduce their ohmic resistance. These bus bars are also made as wide as possible for the same reason, although the width is not nearly as critical as the thickness in determining resistance.

The thickness of the bus bars is limited by the effect that non-uniformities in thickness may have on the respective phases of the surface acoustic waves which travel back and forth beneath these bus bars. As the bus bar thickness increases, it becomes more difficult to maintain uniformity so that variations in phase, due to differences in mass loading between the various paths of travel, may occur.

Figure 16:
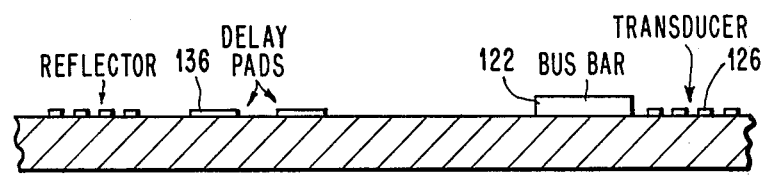
FIG. 16 is a cross-sectional view, greatly enlarged, of a section of the transducer illustrated in FIGS. 8 and 9.

In the preferred embodiment of the invention, the bus bars 122 and 124 are made approximately twice as thick as the other metallized elements on the substrate, as represented in the cross-sectional view of FIG. 16. Specifically, the transducers, delay pads and reflectors are formed by depositing 1000 Angstroms of aluminum on the substrate, whereas the bus bars are formed by depositing 2000 Angstroms of aluminum over 300 Angstroms of chromium. The chromium provides a good bond between the aluminum and the lithium niobate surface.

In practice, the metallization is deposited on the substrate surface using a two-layer photolithographic process. Two separate reticles are used in forming the photolithographic image: one reticle for the transducers, reflectors and phase pads as well as the alignment marks on the substrate, and a separate reticle for the bus bars.

Figure 17:
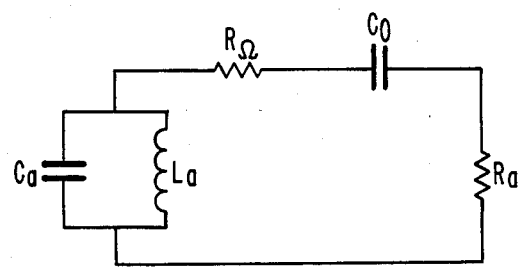
FIG. 17 is an equivalent circuit diagram showing the resistance and capacitance of a SAW transducer.

FIG. 17 illustrates the equivalent circuit of the transponder according to the invention. Shown at the left of the diagram are the capacitance $C_a$ and inductance $L_a$ of the dipole antenna. According to the invention, this reactive impedance is matched, as closely as possible, to the reactive impedance $C_0$ of the four transducers so that only the resistance losses $r_\Omega$ and $r_a$ affect the coupling. Also according to the invention, the ohmic resistance $r_\Omega$ is reduced as much as possible by increasing the thickness and width of the bus bars.

Figure 18:
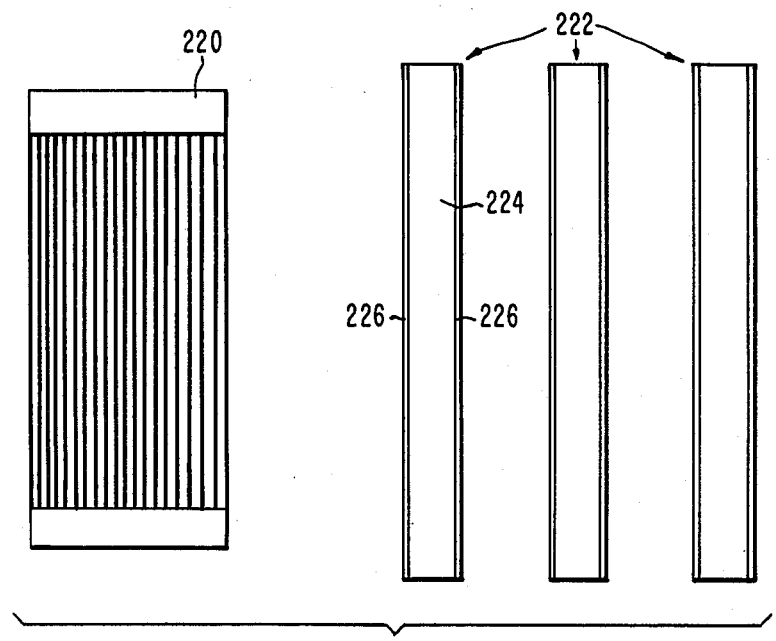
FIG. 18 is a plan view, in greatly enlarged scale, of a reflector and three delay pads in the transducer configuration of FIGS. 8 and 9.

FIG. 18 shows, in enlarged scale, a single reflector 220 and three delay pads 222. Each of the delay pads is illustrated as having a central metallized portion 224 and two edge portions According to still another feature of the invention, the edge portions 226 of the delay pads, as well as the lateral edges of the bus bars 122 and 124 (i.e., the edges transverse to the SAW paths of travel) are provided with two levels of serrations to substantially reduce SAW reflections from these edges.

Figure 19:
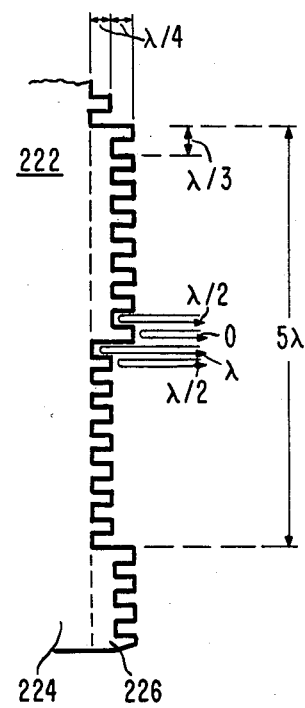
FIG. 19 is a plan view, in greatly enlarged scale, of the edge of a delay pad showing anti-reflection serrations.

FIG. 19 illustrates the lower right-hand corner of a delay pad 222 in greatly enlarged scale. As may be seen, the serrations comprise two superimposed "square waves" having the same pulse height but different pulse periods. The pulse height for both square waves is $\lambda/4$. By way of example and not limitation, the pulse period is $\lambda/3$ for one square wave and $6\lambda$ for the other, where $\lambda$ is the SAW wavelength at 915 MHz.

The affect of the serrations in cancelling reflections is indicated at the center of FIG. 19. Shown there are the SAW reflections from the various levels of the delay pad edge. It will be understood that the wavefronts of reflections having phases of $\lambda/2$ will be equal and opposite in phase to the reflected wavefronts having phases of 0 and $\lambda$.

Although it is known to provide a single set of serrations (e.g., square wave serrations) to reduce SAW reflections, it is believed to be novel to provide two superimposed levels of serrations of different periodicity. Whereas one level of serrations is capable of reducing reflections, the second level serves to break up the average reflection plane.

Unlike the transducers, the reflectors 0, 1, 2 . . . E, F used in the embodiment of FIGS. 8 and 9 are designed for a fundamental frequency of 915 MHz. Therefore, the distance between successive reflector fingers is $\lambda/2$ and the width of each finger is approximately $\lambda/4$, where $\lambda$ is the SAW wavelength at 915 MHz. By way of example and not limitation, each reflector has a total of 20 fingers.

Figure 20:
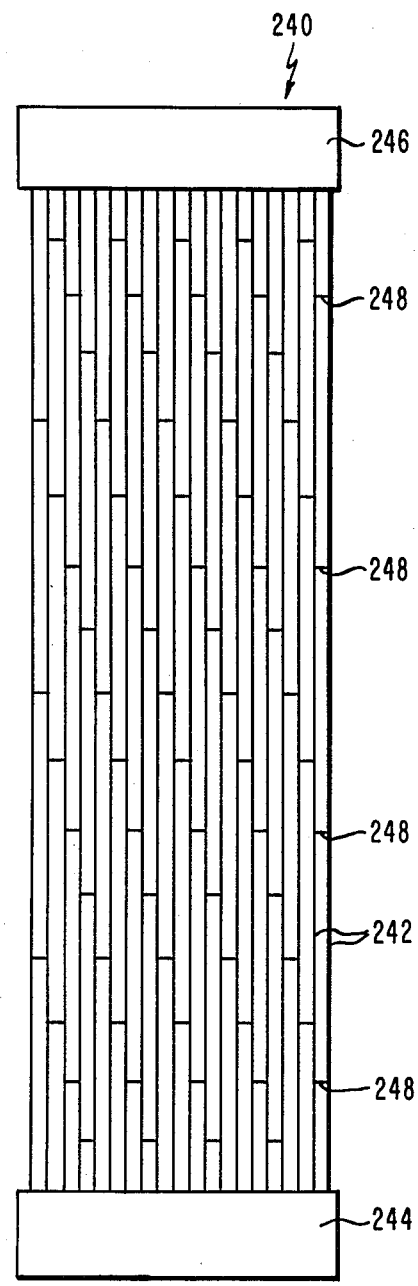
FIG. 20 is a plan view, in greatly enlarged scale, of a reflector having numerous short circuits between the respective reflector fingers.

FIG. 20 illustrates a particular reflector 240 which may be employed as reflectors 0, 1, 2 . . . , E, F in the embodiment of FIG. 8. According to a further feature of the present invention, the reflector 240 comprises a plurality of fingers 242 (in this case 20) connected between two shorting bus bars 244 and 246. According to the invention, each two successive fingers are also shorted at one or more locations between the bus bars. Thus, in the embodiment shown, the two fingers 242 on the right-hand side of the reflector are shorted at four locations by interconnecting metallization 248. The shorts between successive fingers reduce energy loss due to ohmic resistance of the fingers and render the reflector less susceptible to fabrication errors.

As noted above, the distance between successive fingers in the reflector must be equal to $\lambda/2$, where $\lambda$ is the SAW wavelength at 915 MHz. Consequently, the width of each finger must be somewhat less than $\lambda/2$: by way of example and not limitation it may be approximately $\lambda/4$ or about 1 micron. Such a finger width nudges the lower boundary of conventional photolithographic fabrication techniques so that one or more fingers of a reflector may, in practice, be interrupted along their length. The short circuit bridges between successive fingers make it possible to retain the function of all fingers of a reflector, although one or more fingers may not extend the entire distance between the bus bars 244 and 246.

In summary, the present invention provides a number of features in a passive SAW transponder which (1) reduce interference caused by unwanted SAW reflections in the transponder substrate and (2) increase the percentage of energy coupled into and out of the substrate.

There has thus been shown and described a passive interrogator label system (PILS) with a novel, passive SAW transponder which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. In an interrogation system having means for producing an interrogating signal in a prescribed frequency range and a passive transponder for transmitting a reply signal containing encoded information in response to the receipt of said interrogating signal, said transponder comprising:

(a) a substrate having a substrate surface, said substrate being capable of propagating acoustic waves on said surface along a plurality of paths of travel;

(b) at least one transducer arranged on said surface for converting between electrical energy and surface acoustic wave (SAW) energy which propagates on said surface along said paths of travel, said transducer having its fundamental, resonant frequency $f_o = f/n$, where f is a frequency within said prescribed range and n is an odd integer; said transducer comprising an interdigital finger structure, with adjacent, parallel fingers spaced apart by a distance $\lambda_0/2$, each finger being split into two parallel, electrically connected finger elements, each being spaced apart by a distance of $\lambda_0/4$ and having a width of approximately $\lambda_0/8$, where $\lambda$ is the SAW wavelength on said surface at said fundamental frequency $f_0$; adjacent ones of said fingers being electrically connected at their opposite ends, respectively, to form a plurality of finger pairs, each pair being capable of converting between electrical energy and SAW energy; said transducer having a sufficient number of finger pairs to convert at least approximately 40% of the supplied energy into another form of energy; and said transducer having a bandwidth of at least said prescribed frequency range;

(c) a plurality of acoustic wave reflectors arranged on said surface along said paths of travel for reflecting said SAW energy back toward said transducer; and (d) circuit means electrically connected to said opposite ends, respectively, of said finger pairs in said transducer, for supplying said interrogating signal to said transducer and for receiving said reply signal from said transducer.

2. The interrogation system defined in claim 1, wherein $n=3$.

3. The interrogation system defined in claim 1, wherein said at least one transducer in said transponder comprises a plurality of fingers arranged in a plurality of parallel sections:

(a) an operative central section having a plurality of pairs of interdigital fingers;

(b) two dummy sections, flanking both sides of said central section, each having dummy fingers; and (c) two operative outer sections, flanking said dummy sections, each having at least one pair of interdigital fingers, whereby the frequency response of said outer sections combines with the frequency response of said inner section to increase the bandwidth of said transducer.

4. The interrogation system defined in claim 3, wherein said two dummy sections are identical.

5. The interrogation system defined in claim 3, wherein said two outer sections are identical.

6. The interrogation system defined in claim 1, wherein said at least one transducer in said transponder is divided, in the longitudinal direction of said fingers, into m serially-connected, substantially identical, transducer sections, thereby to reduce the capacitance of said transducer.

7. The interrogation system defined in claim 6, wherein m=2.

8. The interrogation system defined in claim 1, wherein there are a plurality of metallized transducers arranged on said surface for converting between electrical energy and SAW energy which propagates on said surface along said plurality of travel paths, each transducer having at least two electrical terminals and a plurality of interdigitial fingers connected to said terminals; and
at least one metallized bus bar arranged on said surface and connected to at least one terminal of at least one transducer, the metallization of said bus bar being substantially thicker than that of said one transducer.

9. The transponder defined in claim 8, wherein said metallization of said bus bar is approximately twice as thick as the metallization forming the fingers of said transducer.

10. The transponder defined in claim 8, wherein said metallization of said bus bar comprises a layer of approximately 2000 Angstroms of aluminum.

11. The transponder defined in claim 10, wherein said metallization of said bus bar comprises a layer of approximately 300 Angstroms of chromium between said substrate and said aluminum layer.

12. The interrogation system defined in claim 1, wherein said transponder further includes at least one area of metallization, disposed on said surface in at least one of said travel paths, which reduces the velocity of surface acoustic waves that pass through said area, said area having an edge facing said respective travel path shaped with at least two superimposed square waves of different wavelength, the pulse height of each square wave being n $\lambda/4$, where n is an odd integer (1, 3, ...) and $\lambda$ is the center wavelength of the acoustic waves on aid surface, whereby surface acoustic wave reflections from said edge of said metallization are substantially reduced.

13. The transponder defined in claim 12, wherein the wavelength of a first square wave is a multiple of the wavelength of a second square wave, and wherein said first and second square waves start a cycle at the same point on said edge.

14. The transponder defined in claim 12, wherein n=1.

15. The interrogation system defined in claim 1, wherein said reflectors comprise a plurality of parallel fingers connected together at opposite ends and spaced apart a distance of n $\lambda/2$, where n is an odd integer, successive ones of said fingers being shorted together at at least one position along their lengths.

16. The transponder defined in claim 15, wherein all successive pairs of fingers are shorted together at at least one position along their lengths.

17. The transponder defined in claim 15, wherein successive pairs of fingers are shorted at a plurality of positions along their lengths.

18. The interrogation system defined in claim 1, wherein said prescribed frequency range is sufficiently wide to resolve the differences in time between the respective successive delays introduced by said transponder between the receipt of an interrogation signal and the transmission of a reply in response thereto.

19. The interrogation system defined in claim 18, wherein said prescribed frequency range is equal to approximately 20 MHz.

* * * * *